(12) United States Patent
Nourbakhsh et al.

(10) Patent No.: US 11,769,665 B2
(45) Date of Patent: Sep. 26, 2023

(54) POWER DEVICE STRUCTURES AND METHODS OF MAKING (71) Applicant: Applied Materials, Inc., Santa Clara, CA (US)

(72) Inventors: Amirhasan Nourbakhsh, Albany, NY (US); Raman Gaire, Mechanicville, NY (US); Tyler Sherwood, Fonda, NY (US); Lan Yu, Voorheesville, NY (US); Roger Quon, Rhinebeck, NY (US); Siddarth Krishnan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 54 days.

(21) Appl. No.: 17/572,963

(22) Filed: Jan. 11, 2022

(65) Prior Publication Data
US 2023/0223256 A1 Jul. 13, 2023

(51) Int. Cl.
*H01L 21/02* (2006.01)

(52) U.S. Cl.
CPC .. *H01L 21/02576* (2013.01); *H01L 21/02532* (2013.01); *H01L 21/02579* (2013.01)

(58) Field of Classification Search
CPC ........ H01L 21/02576; H01L 21/02532; H01L 21/02579; H01L 21/02104; H01L 2924/13051; H01L 29/06; H01L 29/02; H01L 23/04
See application file for complete search history.

(56) References Cited

U.S. PATENT DOCUMENTS

| | | | |
|---|---|---|---|
| 2006/0043478 A1 | 3/2006 | Yamaguchi et al. | |
| 2006/0160309 A1 | 7/2006 | Hshieh | |
| 2008/0102582 A1* | 5/2008 | Takei | H01L 29/7813 |
| | | | 257/E29.066 |
| 2008/0111207 A1 | 5/2008 | Lee et al. | |

(Continued)

FOREIGN PATENT DOCUMENTS

WO 2009034658 A1 3/2009

OTHER PUBLICATIONS

Application No. PCT/US2022/054385, International Search Report and Written Opinion, dated May 3, 2023, 11 pages.

*Primary Examiner* — Julio J Maldonado
*Assistant Examiner* — Sandra Milena Rodriguez Villanu
(74) *Attorney, Agent, or Firm* — Kilpatrick Townsend & Stockton LLP (57) ABSTRACT

Exemplary semiconductor processing methods may include forming a p-type silicon-containing material on a substrate including a first n-type silicon-containing material defining one or more features. The p-type silicon-containing material may extend along at least a portion of the one or more features defined in the first n-type silicon-containing material. The methods may include removing a portion of the p-type silicon-containing material. The portion of the p-type silicon-containing material may be removed from a bottom of the one or more features. The methods may include providing a silicon-containing material. The methods may include depositing a second n-type silicon-containing material on the substrate. The second n-type silicon-containing material may fill the one or more features formed in the first n-type silicon-containing material and may separate regions of remaining p-type silicon-containing material.

19 Claims, 4 Drawing Sheets

(56) References Cited

U.S. PATENT DOCUMENTS

| | | |
|---|---|---|
| 2009/0075461 A1 | 3/2009 | Ishida et al. |
| 2009/0179298 A1* | 7/2009 | Cheng ............... H01L 29/66143 438/433 |
| 2016/0260797 A1* | 9/2016 | Sato .................. H01L 29/66477 |
| 2019/0043958 A1* | 2/2019 | Moens ................ H01L 21/0262 |

* cited by examiner

POWER DEVICE STRUCTURES AND METHODS OF MAKING

TECHNICAL FIELD

The present technology relates to semiconductor systems, processes, and equipment. More specifically, the present technology relates to processes and systems to improve scaling for high aspect ratio power devices.

BACKGROUND

Integrated circuits are made possible by processes which produce intricately patterned material layers on substrate surfaces. Producing patterned material on a substrate requires controlled methods for forming and removing material. As device sizes continue to reduce, features within the integrated circuits may get smaller and aspect ratios of structures may grow, and maintaining dimensions of these structures during processing operations may be challenged. Some processing may result in recessed features in the materials that may have uneven, or tapered, sidewalls due to increased exposure during processing. Developing materials with straight sidewalls may become more difficult. Further, backfilling recessed features with material without any seams and/or voids may also become more difficult.

Thus, there is a need for improved systems and methods that can be used to produce high quality devices and structures. These and other needs are addressed by the present technology.

SUMMARY

Exemplary semiconductor processing methods may include forming a p-type silicon-containing material on a substrate including a first n-type silicon-containing material defining one or more features. The p-type silicon-containing material may extend along at least a portion of the one or more features defined in the first n-type silicon-containing material. The methods may include removing a portion of the p-type silicon-containing material. The portion of the p-type silicon-containing material may be removed from a bottom of the one or more features. The methods may include providing a silicon-containing material. The methods may include depositing a second n-type silicon-containing material on the substrate. The second n-type silicon-containing material may fill the one or more features formed in the first n-type silicon-containing material and may separate regions of remaining p-type silicon-containing material.

In some embodiments, the one or more features may be characterized by a width of greater than or about 1.5 µm. The p-type silicon-containing material may be characterized by a thickness of between about 5 nm and about 250 nm. A temperature within the semiconductor processing chamber may be maintained greater than or about 600° C. while forming the p-type silicon-containing material on the substrate. The methods may include providing an oxygen-containing precursor and forming an oxygen-containing material over at least a portion of the p-type silicon-containing material. The oxygen-containing precursor may passivate at least a portion of the p-type silicon-containing material. The methods may include removing the oxygen-containing material from the p-type silicon-containing material prior to depositing the second n-type silicon-containing material. The first n-type silicon-containing material and the second n-type silicon-containing material may be doped within phosphorous, arsenic, or a combination of both. The p-type silicon-containing material may be doped within boron. A ratio of a width of the second n-type silicon-containing material to a width of the p-type silicon-containing material may be greater than or about 15. The p-type silicon-containing material may be characterized by an aspect ratio of greater than or about 50. The methods may include removing a portion of the second n-type silicon-containing material extending above the first n-type silicon-containing material, the p-type silicon-containing material or both. In some embodiments, the p-type silicon-containing material may be a first p-type silicon-containing material. The methods may further include forming a second p-type silicon-containing material on the substrate. The second p-type silicon-containing material may connect individual portions of the first p-type silicon-containing material.

Some embodiments of the present technology may encompass semiconductor processing methods. The methods may include forming a p-type silicon-containing material on a substrate. The p-type silicon-containing material may extend along at least a portion of one or more features defined in a first n-type silicon-containing material on the substrate. The methods may include removing a portion of the p-type silicon-containing material. The portion of the p-type silicon-containing material that is removed may be located at a bottom of the one or more features. The methods may include depositing a second n-type silicon-containing material on the substrate. The second n-type silicon-containing material may fill the one or more features.

In some embodiments, the one or more features may be characterized by an aspect ratio greater than or about 40. The p-type silicon-containing material may be characterized by a thickness of less than or about 150 nm. A ratio of a width of the first n-type silicon-containing material or the second n-type silicon-containing material to a width of the p-type silicon-containing material may be greater than or about 15. The p-type silicon-containing material may be conformally formed along sidewalls of the one or more features defined in the first n-type silicon-containing material. The methods may include forming an oxygen-containing material over at least a portion of the p-type silicon-containing material. The oxygen-containing precursor may passivate at least a portion of the p-type silicon-containing material. The methods may include contacting the oxygen-containing material with an etching reagent. The etching reagent may remove the oxygen-containing material. The second n-type silicon-containing material may fill the one or more features free of any voids and without intermittent etching.

Some embodiments of the present technology may encompass power devices. The devices may include a first silicon-containing material and a second silicon-containing material. The first silicon-containing material may define one or more features characterized by an aspect ratio greater than or about 50. The first silicon-containing material may be or include n-type silicon. The second silicon-containing material may be disposed in the one or more features defined by the first silicon-containing material. The second silicon-containing material may be or include p-type silicon. The second silicon-containing material may conformally fill the one or more features. The second silicon-containing material may be free of voids within the one or more features.

Such technology may provide numerous benefits over conventional methods and techniques. For example, the processes may allow wider features to be formed in substrate materials while producing higher aspect ratio structures. Additionally, by increasing initial feature width, improved etch profiles may be produced through a substrate material, which may improve device uniformity and fill. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device sizes continue to shrink, many material layers may be reduced in thickness and size to scale devices. Features inside semiconductor structures may be reduced in size, and aspect ratios of the features may increase. As the aspect ratios of the features increase, patterning operations may struggle to uniformly etch features without tapering the sidewalls of the feature, or compromising feature dimensions or integrity, due to increased exposure nearer a surface of the substrate material being processed. Further, refilling a feature with higher aspect ratios may be increasingly difficult due to pinch off at the top of the feature that prevents the feature from being filled without seams and/or voids.

In forming power device structures, conventional technologies have been limited in device scaling for increased aspect ratio features based on the natural effects of prolonged etching and deposition operations. For example, in super junction structures, p-type silicon pillars are formed by filling trenches etched into n-type silicon with p-type material. In these structures, the on-resistance is controlled by the pitch or width of the different materials. The resistance may be improved by reducing the width of the p-type silicon pillars. Scaling the p-type silicon pillars is limited by etching and seam and/or void free trench filling capabilities. For example, increasing aspect ratio with conventional etching may cause pitch degradation and tapered features due to the prolonged exposure of upper regions of the feature being formed. Additionally, the fill operation of high-aspect ratio features may lead to pinch off before deeper regions of the feature are filled. Consequently, conventional technologies have been limited to lower aspect ratios, or shorter structures to limit performance effects or device failure. Accordingly, many conventional technologies have been limited in the ability to prevent structural flaws in the final devices or improve on historical designs.

The present technology overcomes these issues by redefining the way in which the pillars are formed in the base material. By forming a thin epitaxial liner within a wider overall feature prior to backfill, the pillars of material can be maintained at much smaller widths compared to conventional technologies. More specifically, the width of the pillars of material may be defined by the width of the epitaxial liner rather than the width of the recessed features. In fact, the recessed features can be made wider than conventional technologies as two pillars may be deposited on sidewalls of each recessed feature. After forming materials on the sidewalls, the recessed features may be backfilled with additional base material. By changing the formation process itself, the present technology may afford much greater aspect ratio features, and also may prevent or reduce defects in final devices based on more uniform fill and coverage.

Although the remaining disclosure will routinely identify specific etching and deposition processes utilizing the disclosed technology, it will be readily understood that the systems and methods are equally applicable to a variety of other processes as may occur in the described chambers. Accordingly, the technology should not be considered to be so limited as for use with the described etching or deposition processes alone. The disclosure will discuss one possible system that can be used with the present technology before describing systems and methods or operations of exemplary process sequences according to some embodiments of the present technology. It is to be understood that the technology is not limited to the equipment described, and processes discussed may be performed in any number of processing chambers and systems.

Figure 1:
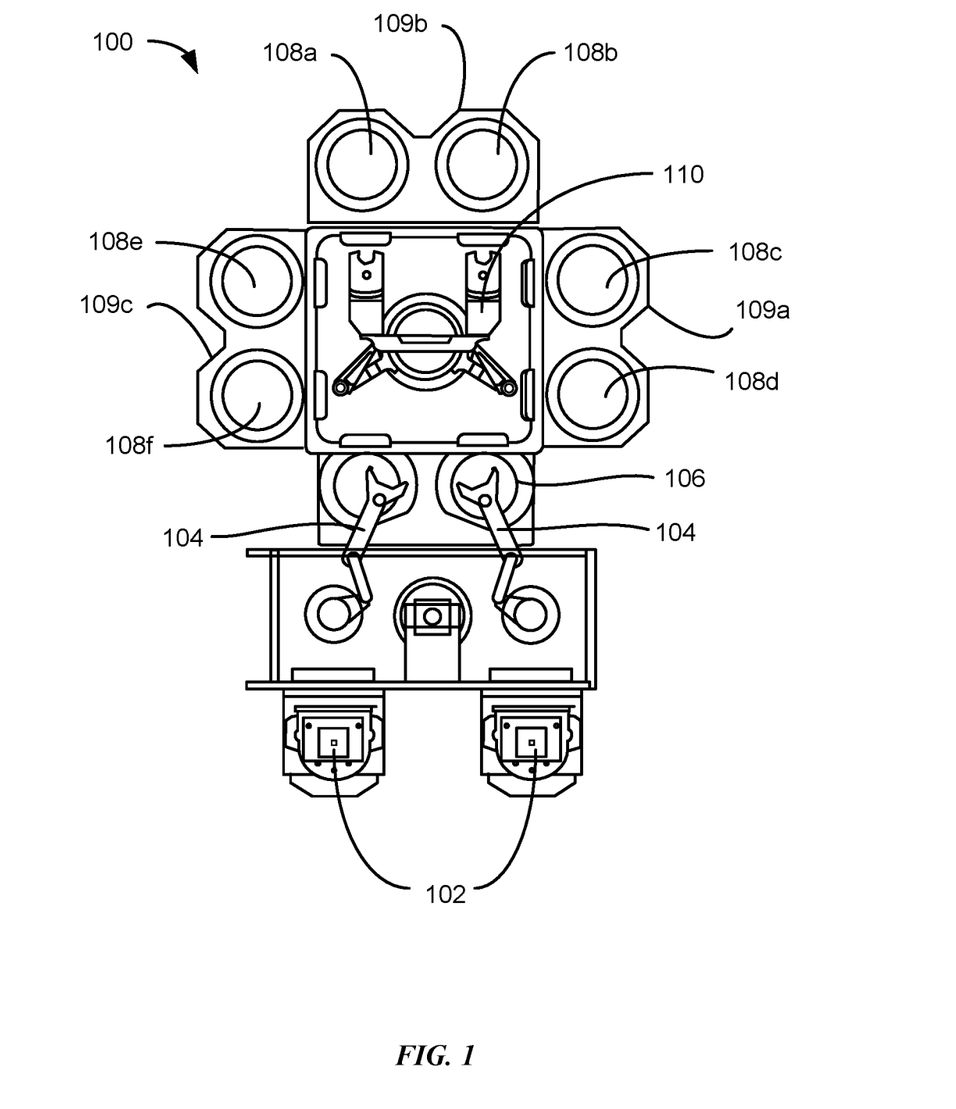
FIG. 1 shows a schematic top plan view of an exemplary processing system according to some embodiments of the present technology.

FIG. 1 shows a top plan view of one embodiment of a processing system 100 of deposition, etching, baking, and curing chambers that may be included or configured according to some embodiments of the present technology. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, anneal, plasma processing, degas, orientation, and other substrate processes.

The substrate processing chambers 108a-f may include one or more system components for depositing, annealing, curing and/or etching a material film on the substrate or wafer. In one configuration, two pairs of the processing chambers, for example 108c-d and 108e-f, may be used to deposit material on the substrate, and the third pair of processing chambers, for example 108a-b, may be used to cure, anneal, or treat the deposited films. In another configuration, all three pairs of chambers, for example 108a-f, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by system 100. Additionally, any number of other processing systems may be utilized with the present technology, which may incorporate chambers for performing any of the specific operations. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

Figure 2:
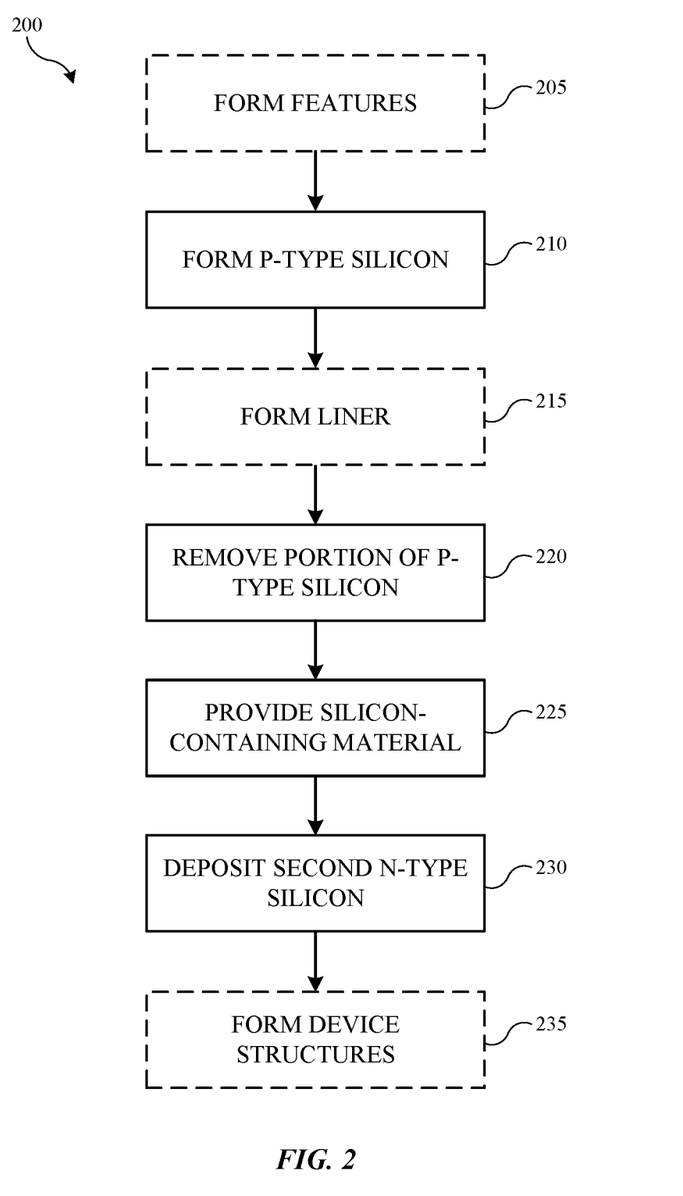
FIG. 2 shows exemplary operations in a semiconductor processing method according to some embodiments of the present technology.

System 100, or more specifically chambers incorporated into system 100 or other processing systems, may be used to produce structures according to some embodiments of the present technology. FIG. 2 illustrates a method 200 of semiconductor processing according to some embodiments of the present technology. Method 200 may be performed in one or more processing chambers, such as chambers incorporated in system 100, for example. Method 200 may or may not include one or more operations prior to the initiation of the method, including front-end processing, deposition, etching, polishing, cleaning, or any other operations that may be performed prior to the described operations. The method may include a number of optional operations as denoted in the figure, which may or may not be specifically associated with some embodiments of methods according to the present technology. Method 200 describes operations shown schematically in FIGS. 3A-3I, the illustrations of which will be described in conjunction with the operations of method 200. It is to be understood that the figures illustrate only partial schematic views with limited details, and in some embodiments a substrate may contain any number of semiconductor sections having aspects as illustrated in the figures, as well as alternative structural aspects that may still benefit from any of the aspects of the present technology.

Figure 3A:
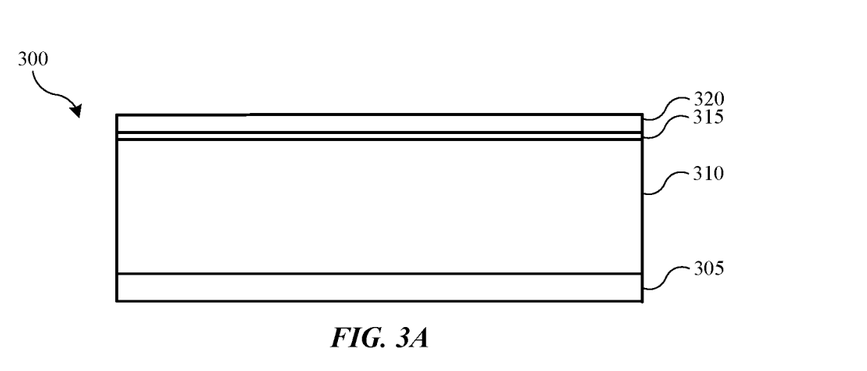
FIGS. 3A-3I show exemplary schematic cross-sectional structures in which material layers are included and produced according to some embodiments of the present technology.

As illustrated in FIG. 3A, the structure 300 may include a substrate 305. Substrate 305 may have a substantially planar surface or an uneven surface in embodiments. The substrate 305 may be a material such as crystalline silicon, silicon oxide, strained silicon, silicon germanium, doped or undoped polysilicon, doped or undoped silicon wafers, patterned or non-patterned wafers, silicon on insulator, carbon doped silicon oxides, silicon nitride, doped silicon, germanium, gallium arsenide, or sapphire. As one non-limiting example, in some embodiments the substrate may be or include an N+ material, such as N+ silicon. The substrate 305 may have various dimensions, such as 200 mm or 300 mm diameter wafers, as well as rectangular or square panels. Substrate 305 may be disposed within the processing region of the semiconductor processing chamber. Although shown as a planar substrate, it is to be understood that substrate 305 is included merely to represent an underlying structure, which may include any number of layers or features on a wafer or other substrate, and over which structures as described below may be formed.

The substrate 305 may include a first n-type silicon-containing material 310. The first n-type silicon-containing material 310 may be disposed along at least a portion or all of the substrate 305. The first n-type silicon-containing material 310 may be n-type silicon, and which may be doped with phosphorous, arsenic, or a combination of both. In some embodiments to facilitate patterning of the first n-type silicon-containing material 310, hard masks, photoresists, or any other mask materials may be disposed along the first n-type silicon-containing material 310. As illustrated in FIG. 3A, a first mask 315 may be formed over the first n-type silicon-containing material 310 and a second mask 320 may be formed over the first mask 315. In embodiments, either or both masks may be any number of materials to promote structural formation, such as oxides, nitrides, carbides, or some combination of materials. For example, first mask 315 may be or include silicon nitride, second mask 320 may be or include silicon oxide, or some other mask material. It is contemplated that a singular mask may be provided over the first n-type silicon-containing material 310 and the embodiment depicted in FIG. 3A is merely one example structure 300.

Figure 3B:
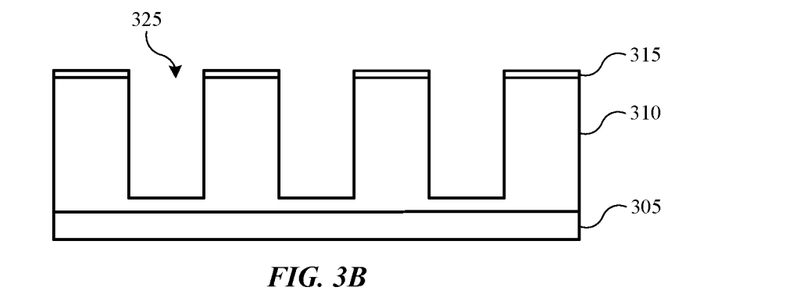

As shown in FIG. 3B, a pattern may be etched or formed through the first mask 315 and/or the second mask 320 to form features at optional operation 205. The pattern may be etched through the first mask 315 and/or the second mask 320 using any etching processes and any etching reagents. The pattern in the first mask 315 and/or the second mask 320 may form features or gaps in the first mask 315 and/or the second mask 320. In embodiments, the etching may completely remove the second mask 320 as a pattern is transferred into the underlying silicon-containing material 310. The pattern may not extend fully through a thickness of the first mask 315, while removing the second mask 320 such that the first n-type silicon-containing material 310 is at least partially exposed and subsequently etched.

The etching of the first n-type silicon-containing material 310 may form one or more features 325 in the material. The features 325 may have an aspect ratio, or a depth-to-width ratio less than or about 50, less than or about 40, less than or about 30, less than or about 25, less than or about 20, less than or about 15, less than or about 10, or less. Additionally, features 325 may be formed to a depth of greater than or about 10 µm, and may be formed to a depth of greater than or about 15 µm, greater than or about 20 µm, greater than or about 25 µm, greater than or about 30 µm, greater than or about 35 µm, greater than or about 40 µm, greater than or about 45 µm, greater than or about 50 µm, greater than or about 55 µm, greater than or about 60 µm, greater than or about 65 µm, greater than or about 70 µm, greater than or about 75 µm, greater than or about 80 µm, greater than or about 85 µm, greater than or about 90 µm, greater than or about 95 µm, greater than or about 100 µm, or greater. Further, features 325 may be formed to a width of greater than or about 1.5 µm, and may be formed to a depth of greater than or about 2.0 µm, greater than or about 2.5 µm, greater than or about 3.0 µm, greater than or about 3.5 µm, greater than or about 4.0 µm, greater than or about 4.5 µm, greater than or about 5.0 µm, greater than or about 6.0 µm, greater than or about 7.0 µm, greater than or about 8.0 µm, greater than or about 9.0 µm, greater than or about 10.0 µm, or greater.

While conventional methods may strive for etching higher aspect ratio features to allow for narrower and deeper p-type material regions to be deposited, forming features with higher aspect ratios may make structural formation more difficult. Not only may it be difficult to etch high aspect ratio features with consistent diameters, but it may also be difficult to backfill these features with uniform material. Instead, the backfill material may have seams and/or voids present due to pinch off at the top of the feature during fill. Conversely, the present technology may counterintuitively allow for relaxing the width of the features 325 to produce smaller pitch structures or higher aspect ratio structures, which may allow for more uniform etching and subsequent backfill. Further, with an increased diameter of the feature 325, deeper etching of the first n-type silicon-containing material 310 may be afforded. As an additional benefit of deeper etching, and therefore deeper structures of material, increased breakdown voltages for power devices produced by the present technology may be afforded compared to conventional methods and technology.

Figure 3C:
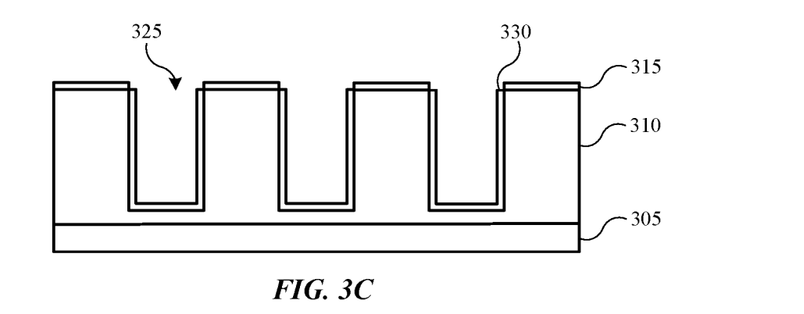

As shown in FIG. 3C, at operation 210, the method 200 may include forming a p-type silicon-containing material 330 on the substrate 405. The p-type silicon-containing material 330 may be deposited or formed on the first n-type silicon-containing material 310. The deposition or formation may be performed in any number of ways, and in some embodiments the material may be formed conformally about the feature. The p-type material, which may be p-type silicon, for example, may be deposited by atomic layer deposition, grown epitaxially, or produced by any number of other processes to produce conformal coverage about the structure. By having features characterized by wider pitch, the coverage may be more uniform based on the relatively lower aspect ratios of the wider features initially formed. The p-type silicon-containing material 330 may be characterized by a thickness of less than or about 200 nm, less than or about 150 nm, less than or about 100 nm, less than or about 90 nm, less than or about 80 nm, less than or about 70 nm, less than or about 60 nm, less than or about 50 nm, less than or about 40 nm, less than or about 30 nm, less than or about 20 nm, less than or about 10 nm, less than or about 5 nm, or less. The p-type silicon-containing material 330 may be a silicon-containing material doped with boron. In embodiments, the p-type silicon-containing material 330 may also include germanium. The p-type silicon-containing material 330 may be free of seams and/or voids based on the conformal coverage about the structure, even to a depth of several micrometers, which may provide large improvements on performance for final devices compared to conventional technologies, which may have reduced or incomplete coverage at greater depths, as well as seam or void formation, which may affect device performance, such as breakdown voltage. However, it is contemplated that some pores may be present in the p-type silicon-containing material depending on the formation and thickness.

The p-type silicon-containing material 330 may be conformally formed along sidewalls of the one or more features 325 defined in the first n-type silicon-containing material 310. The first mask 315 may increase selectivity and conformality of the p-type silicon-containing material 330. If the first mask 315 is not present, the p-type silicon-containing material 330 may have peaks that form at the top of the first n-type silicon-containing material 310 between the features 325. When the first mask 315 is present, such as a nitride mask, the p-type silicon-containing material 330 may be selective to the first n-type silicon-containing material 310 and may form on the first mask 315 at a much slower rate.

Figure 3D:
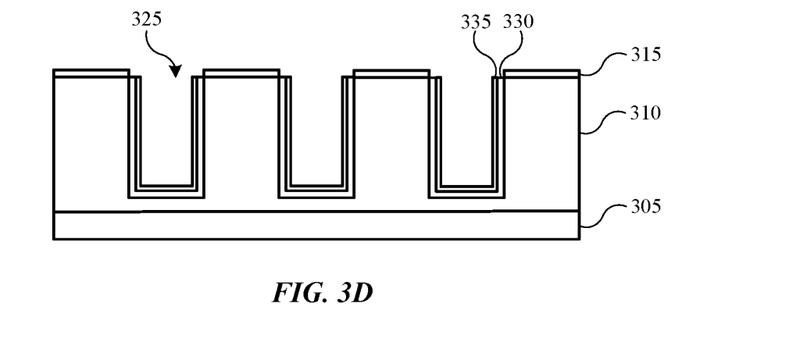

As shown in FIG. 3D, the method 200 may include forming a passivation layer 335 at optional operation 215. The passivation layer 335 may be formed by providing an oxygen-containing precursor to the processing region. Oxygen-containing precursors that may be used in operation 215 may be or include any number of oxygen-containing precursors. The oxygen-containing precursor may be any number of precursors that may oxidize the p-type silicon-containing material 330. As non-limiting examples, in embodiments of the present technology the oxygen-containing precursor may be or include diatomic oxygen, ozone, nitrous oxide, nitric oxide, sulfur dioxide or any other oxygen-containing precursors which may be delivered with or without plasma enhancement, and may be used to oxidize a depth of the existing material, or may be delivered with any other precursor, such as a silicon-containing precursor to deposit an oxide layer. The passivation layer 335 may be formed by using any deposition or growth method. The passivation layer 335 may be formed over at least a portion of the p-type silicon-containing material 330. The oxygen-containing material in the passivation layer 335 may oxidize and passivate at least a portion of the p-type silicon-containing material 330. The passivation layer 335 may serve to protect the p-type silicon-containing material 330 during subsequent etch operations.

Figure 3E:
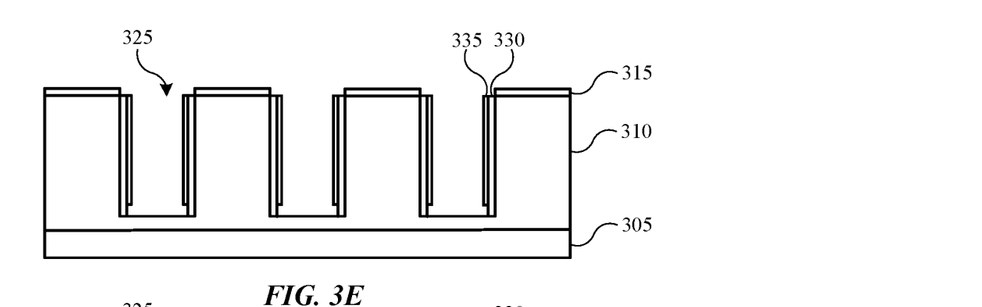

As shown in FIG. 3E, the method 200 may include removing a portion of the p-type silicon-containing material 330 at operation 220. The portion of the p-type silicon-containing material 330 that is removed may be located at a bottom of the one or more features 325. In addition to the portion of the p-type silicon-containing material 330 that is removed, a portion of the passivation layer 335 may also be removed. The portion of the passivation layer 335 that is removed may be located at a bottom of the one or more features 325. In embodiments, removing the portion of the p-type silicon-containing material 330 may include an anisotropic etching process, such as a reactive-ion etching operation or any other directional dry etch process. During operation 220, the method 200 may include applying bias power to etch the bottom of the passivation layer 335 and/or the p-type silicon-containing material 330. The etching of the passivation layer 335 may be due to a sputtering of the oxide in the passivation layer 335, while a more chemical-based removal may occur through the p-type silicon, or vice versa. The bottom of the passivation layer 335 may be sputtered and removed at a faster rate than the sidewalls of the passivation layer 335 due to the anisotropicity of the etch.

Figure 3F:
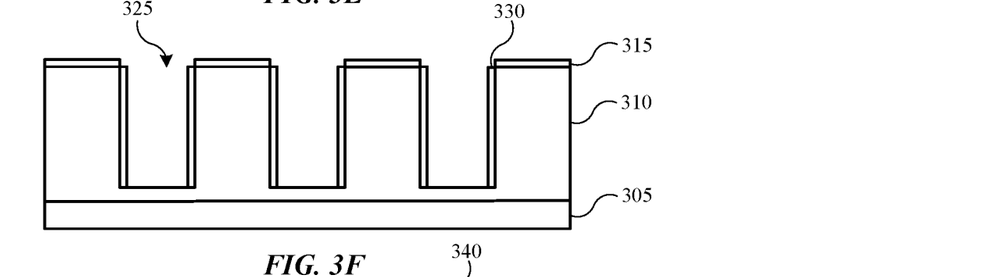

As shown in FIG. 3F, the method 200 may include removing the remaining portion of the passivation layer 335. The portion of the passivation layer 335 that is removed may be located along sidewalls of the one or more features 325 and overlying the p-type material. In embodiments, removing the portion of the passivation layer 335 may include, as one non-limiting example, a wet etching operation using any wet etching reagent(s), such as halogen-containing materials. However, it is contemplated that other forms of etching may alternatively or additionally be utilized including dry etch processes.

The remaining p-type silicon-containing material 330 may be present on the sidewalls of the features 325. The p-type silicon-containing material 330 may be characterized by an aspect ratio of greater than or about 50, greater than or about 100, greater than or about 150, greater than or about 200, greater than or about 250, greater than or about 300, greater than or about 350, greater than or about 400, or more. With taller, narrower features than conventional methods, power devices formed using the structures may be characterized by reduced on-resistance due to the separation distances between features and may be characterized by increased breakdown voltages due to the depth and uniformity of the pillars formed. As previously discussed, the thickness of the remaining p-type silicon-containing material 330 may be less than or about 100 nm, and may be less than 50 nm, less than 20 nm, less than 10 nm, or less. Again, such widths may lead to increased reduction of on-resistance in structures including vertical super junctions based on the reduced separation of n-regions of the material 310.

Figure 3G:
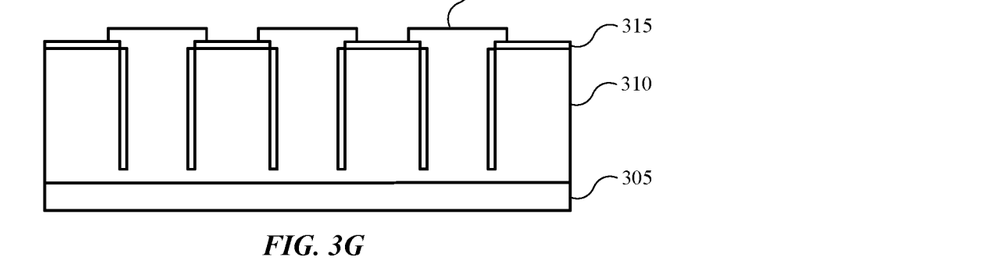

As shown in FIG. 3G, the method 200 may include providing a silicon-containing material at operation 225 and forming a second n-type silicon-containing material 340 on the substrate 305 at operation 230. The second n-type silicon-containing material 340 may fill the one or more features 325 by backfilling the internal region of the features between the sidewalls on which the p-type silicon-containing material 330 has been formed. The second n-type silicon-containing material 340 may fill the one or more features 325 free of any voids and without intermittent etching based on the increased width that may be afforded from the initial feature formation. The second n-type silicon-containing material 340 may be the same material as the first n-type silicon-containing material 310. Together, the first n-type silicon-containing material 310 and the second n-type silicon-containing material 340 may at least partially surround the p-type silicon-containing material 330. A ratio of a width of the second n-type silicon-containing material 340 to a width of the p-type silicon-containing material 330 may be greater than or about 15, and may be greater than or about 20, greater than or about 22, greater than or about 24, greater than or about 26, greater than or about 28, greater than or about 30, or more. The ratio between the two materials may lead to a reduction of on-resistance in subsequent devices produced with these structures, as previously discussed.

Figure 3H:
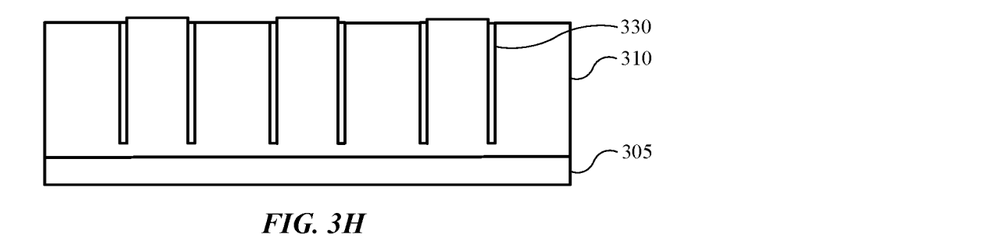
Figure 3I:
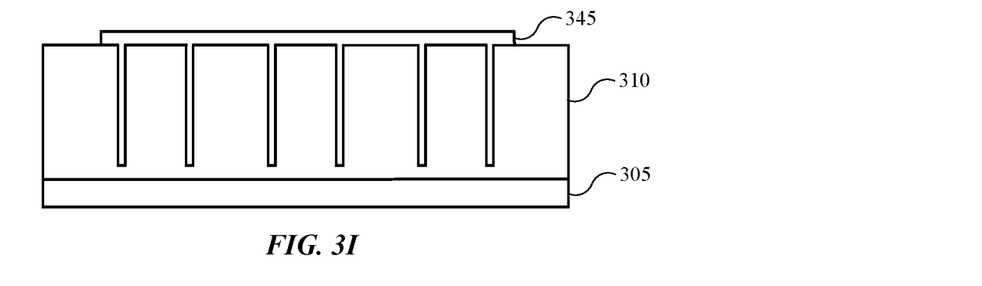

As shown in FIG. 3H, the method 200 may include removing a portion of the second n-type silicon-containing material and any remaining mask material by planarizing the structure, such as with a chemical-mechanical polishing operation. As shown in FIG. 3I, the method 200 may include forming an additional or second p-type silicon-containing material 345 over the first n-type silicon-containing materials 310 and second n-type silicon-containing material 340 at optional operation 235, which may be part of subsequent processing to produce a power diode or other power device structure. The second p-type silicon-containing material 345 may be the same as the p-type silicon-containing material 330 and may connect the individual p-type silicon containing material 330 pillars previously formed. The second p-type silicon-containing material 345 may serve as a top contact in power devices or super junction structures. Optional operation 235 also may include any further post processing to form structures, such as, but not limited to, super junction diodes or metal oxide semiconductor field-effect transistors. This may include, but is not limited to, additional deposition, formation, etching, treatment, or other operations.

Structures according to some embodiments of the present technology, such as power devices, may include any features or characteristics as previously described. In embodiments, a power device may include a first silicon-containing material. The first silicon-containing material may define one or more features characterized by any of the aspect ratios as previously described. The first silicon-containing material may be or include n-type silicon, such as the n-type silicon-containing materials previously described above. The power device may also include a second silicon-containing material disposed in the one or more features defined by the first silicon-containing material. The second silicon-containing material may be or include p-type silicon, such as the p-type silicon-containing material previously described above. The second silicon-containing material may conformally fill the one or more features. A ratio of a width of the first silicon-containing material to a width of second silicon-containing material is greater than or about 15. The second silicon-containing material may be free of voids within the one or more features. By utilizing structures according to embodiments of the present technology, improved power devices characterized by superior operational performance and consistency may be produced.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a pillar" includes a plurality of such pillars, and reference to "the layer" includes reference to one or more layers and equivalents thereof known to those skilled in the art, and so forth.

Also, the words "comprise(s)", "comprising", "contain(s) ", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   forming a p-type silicon-containing material on a substrate including a first n-type silicon-containing material defining one or more features, wherein the p-type silicon-containing material extends along at least a portion of the one or more features defined in the first n-type silicon-containing material;
   removing a portion of the p-type silicon-containing material, wherein the portion of the p-type silicon-containing material is removed from a bottom of the one or more features; and
   depositing a second n-type silicon-containing material on the substrate, wherein the second n-type silicon-containing material fills the one or more features formed in the first n-type silicon-containing material and separates regions of remaining p-type silicon-containing material.

2. The semiconductor processing method of claim 1, wherein:

the one or more features are characterized by a width of greater than or about 1.5 µm.

3. The semiconductor processing method of claim 1, wherein:
the p-type silicon-containing material is characterized by a thickness of between about 5 nm and about 250 nm.

4. The semiconductor processing method of claim 1, wherein:
a temperature is maintained greater than or about 600° C. while forming the p-type silicon-containing material on the substrate.

5. The semiconductor processing method of claim 1, further comprising:
providing an oxygen-containing precursor; and
forming an oxygen-containing material over at least a portion of the p-type silicon-containing material, wherein the oxygen-containing precursor passivates at least a portion of the p-type silicon-containing material.

6. The semiconductor processing method of claim 5, further comprising:
removing the oxygen-containing material from the p-type silicon-containing material prior to depositing the second n-type silicon-containing material.

7. The semiconductor processing method of claim 1, wherein:
the first n-type silicon-containing material and the second n-type silicon-containing material are doped within phosphorous, arsenic, or a combination of both; and
the p-type silicon-containing material is doped within boron.

8. The semiconductor processing method of claim 1, wherein:
a ratio of a width of the second n-type silicon-containing material to a width of the p-type silicon-containing material is greater than or about 15.

9. The semiconductor processing method of claim 1, wherein:
the p-type silicon-containing material is characterized by an aspect ratio of greater than or about 50.

10. The semiconductor processing method of claim 1, further comprising:
removing a portion of the second n-type silicon-containing material extending above the first n-type silicon-containing material, the p-type silicon-containing material or both.

11. The semiconductor processing method of claim 10, wherein:
the p-type silicon-containing material is a first p-type silicon-containing material, the method further comprising:
forming a second p-type silicon-containing material on the substrate, wherein the second p-type silicon-containing material connects individual portions of the first p-type silicon-containing material.

12. A semiconductor processing method comprising:
forming a p-type silicon-containing material on a substrate, wherein the p-type silicon-containing material extends along at least a portion of one or more features defined in a first n-type silicon-containing material on the substrate;
removing a portion of the p-type silicon-containing material, wherein the portion of the p-type silicon-containing material that is removed is located at a bottom of the one or more features; and
depositing a second n-type silicon-containing material on the substrate, wherein the second n-type silicon-containing material fills the one or more features.

13. The semiconductor processing method of claim 12, wherein:
the one or more features are characterized by an aspect ratio greater than or about 40.

14. The semiconductor processing method of claim 12, wherein:
the p-type silicon-containing material is characterized by a thickness of less than or about 150 nm.

15. The semiconductor processing method of claim 12, wherein:
a ratio of a width of the first n-type silicon-containing material or the second n-type silicon-containing material to a width of the p-type silicon-containing material is greater than or about 15.

16. The semiconductor processing method of claim 15, wherein:
the p-type silicon-containing material is conformally formed along sidewalls of the one or more features defined in the first n-type silicon-containing material.

17. The semiconductor processing method of claim 12, further comprising:
forming an oxygen-containing material over at least a portion of the p-type silicon-containing material, wherein the oxygen-containing material passivates at least a portion of the p-type silicon-containing material.

18. The semiconductor processing method of claim 17, further comprising:
contacting the oxygen-containing material with an etching reagent, wherein the etching reagent removes the oxygen-containing material.

19. The semiconductor processing method of claim 12, wherein:
the second n-type silicon-containing material fills the one or more features free of any voids and without intermittent etching.

\* \* \* \* \*